United States Patent
Kim

(10) Patent No.: US 11,040,633 B2
(45) Date of Patent: Jun. 22, 2021

(54) BATTERY PACK FOR VEHICLE

(71) Applicant: Samsung SDI Co., Ltd., Yongin-si (KR)

(72) Inventor: Duk Jung Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 56 days.

(21) Appl. No.: 16/397,934

(22) Filed: Apr. 29, 2019

(65) Prior Publication Data

US 2019/0348664 A1    Nov. 14, 2019

(30) Foreign Application Priority Data

May 8, 2018    (KR) .................. 10-2018-0052738

(51) Int. Cl.
*H01M 2/34*    (2006.01)
*B60L 58/10*    (2019.01)
(Continued)

(52) U.S. Cl.
CPC ............. *B60L 58/10* (2019.02); *B60L 3/0046* (2013.01); *H01H 39/006* (2013.01);
(Continued)

(58) Field of Classification Search
CPC ........ B60L 3/0046; B60L 58/10; B60L 58/18; B60L 58/21; H01H 2039/008;
(Continued)

(56) References Cited

U.S. PATENT DOCUMENTS 9,789,782 B2    10/2017  Holgers et al.
2010/0261048 A1    10/2010  Kim et al.
(Continued)

FOREIGN PATENT DOCUMENTS

KR    10-1147937    6/2012
KR    10-2016-0013900    2/2016
KR    10-1745167    6/2017

OTHER PUBLICATIONS

Baronti, Federico et al.; Design of a Module Switch for Battery Pack Reconfiguration in High-Power Applications, Industrial Electronics (ISIE), 2012 IEEE International Symposium, May 28, 2012, pp. 1330-1335.

(Continued)

*Primary Examiner* — Victoria H Lynch
(74) *Attorney, Agent, or Firm* — Lewis Roca Rothgerber Christie LLP

(57) ABSTRACT

A battery pack includes: a plurality of batteries including a first battery and a second battery; a first input/output port including a first input/output positive port and a first input/output negative port; a second input/output port including a second input/output positive port and a second input/output negative port; a first switch electrically connecting the positive terminal of the second battery to the negative terminal of the first battery or to the second input/output positive port; a second switch electrically connecting the negative terminal of the first battery to the first switch or to the first input/output negative port; and a third switch electrically connecting the negative terminal of the second battery to the first input/output negative port or electrically connecting the second switch to the first input/output negative port or to the second input/output negative port.

10 Claims, 7 Drawing Sheets

(51) Int. Cl.
*B60L 3/00* (2019.01)
*H01H 39/00* (2006.01)
*H01M 10/42* (2006.01)
*H02J 7/00* (2006.01)
*H01M 50/572* (2021.01)
*H01M 50/20* (2021.01)
*H01M 50/502* (2021.01)
*H01M 50/543* (2021.01)
*G01R 31/52* (2020.01)

(52) U.S. Cl.
CPC ....... *H01M 10/4207* (2013.01); *H01M 50/20* (2021.01); *H01M 50/502* (2021.01); *H01M 50/543* (2021.01); *H01M 50/572* (2021.01); *H02J 7/0026* (2013.01); *G01R 31/52* (2020.01); *H01H 2039/008* (2013.01); *H01M 2220/20* (2013.01)

(58) Field of Classification Search
CPC ............ H01H 39/006; H01M 10/4207; H01M 2220/20; H01M 2/1077; H01M 2/202; H01M 2/30; H01M 2/34; H02J 7/0013; H02J 7/0026; H02J 7/0029; H02J 7/0031; H02J 7/0063; Y02E 60/10; Y02T 10/70
See application file for complete search history.

(56) References Cited

U.S. PATENT DOCUMENTS

2017/0194120 A1\* 7/2017 Lei ........................ H02J 7/0034
2017/0373512 A1   12/2017 Wang

OTHER PUBLICATIONS

Extended European Search Report for corresponding European Patent Application No. 19172541.5, dated Aug. 12, 2019, 8 pages.

\* cited by examiner

BATTERY PACK FOR VEHICLE

CROSS-REFERENCE TO RELATED APPLICATION

This application claims priority to and the benefit of Korean Patent Application No. 10-2018-0052738 filed on May 8, 2018 in the Korean Intellectual Property Office, the contents of which in its entirety are herein incorporated by reference.

BACKGROUND

1. Field

Aspects of some example embodiments of the present invention relate to a battery pack for a vehicle.

2. Description of the Related Art

Electric vehicles have been under vigorous development because they are considered as one of the most promising alternatives suggested to solve potential problems of energy exhaustion and pollution due to exhaust gas from vehicles.

Electric vehicles (EVs) are automobiles powered by driving an AC or DC motor mainly using power generated from batteries and are largely classified into battery electric vehicles (BEVs) and hybrid electric vehicles (HEVs). The BEV is driven by a motor using power from batteries that are rechargeable when the power is used up, and the HEV is driven by charging batteries using electricity generated by driving an engine and driving an electric motor using electricity generated from the batteries.

The electric vehicle is a vehicle that runs on electricity supplied from batteries. In a situation where a short circuit is generated in the battery to cut off a voltage output, the vehicle may unintentionally stop, causing a risk to the vehicle.

The Background section of the present Specification includes information that is intended to provide context to example embodiments, and the information in the present Background section does not necessarily constitute prior art.

SUMMARY

The present invention has been made in an effort to address certain issues of the related art, some example embodiments may include a battery pack for a vehicle, which can improve safety by operating the vehicle in a safety mode in which voltages are output while bypassing a short circuited portion, even if an internal short circuit has occurred to the battery pack.

According to some example embodiments of the present invention, a battery pack for a vehicle includes: a plurality of batteries including a first battery and a second battery, a first input/output port including a first input/output positive port electrically connected to a positive terminal of the first battery and a first input/output negative port electrically connected to a negative terminal of the second battery, a second input/output port including a second input/output positive port electrically connected to a positive terminal of the second battery and a second input/output negative port electrically connected to the negative terminal of the second battery, a first switch electrically connecting the positive terminal of the second battery to the negative terminal of the first battery or to the second input/output positive port, a second switch electrically connecting the negative terminal of the first battery to the first switch or to the first input/output negative port, and a third switch electrically connecting the negative terminal of the second battery to the first input/output negative port or electrically connecting the second switch to the first input/output negative port or to the second input/output negative port.

According to some example embodiments, the first switch, the second switch and the third switch may be 3-way switches, and in a normal operating state in which there is no internal short circuit occurring in the battery pack, the first switch, the second switch and the third switch may be configured such that first contact terminals thereof are all electrically connected to a common terminal to output one of voltages of the first battery and the second battery connected in series to the first input/output port through a normal power supply line.

According to some example embodiments, the first switch may be configured such that the common terminal is electrically connected to the positive terminal of the second battery, the first contact terminal is electrically connected to the first contact terminal of the second switch, and a second contact terminal is electrically connected to the second input/output positive port.

According to some example embodiments, the second switch may be configured such that the common terminal is electrically connected to the negative terminal of the first battery, the first contact terminal is electrically connected to the first contact terminal of the first switch, and a second contact terminal is electrically connected between the negative terminal of the second battery and the common terminal of the third switch.

According to some example embodiments, the third switch may be configured such that the common terminal is electrically connected between the negative terminal of the second battery and the second contact terminal of the second switch, the first contact terminal is electrically connected to the first input/output negative port, and a second contact terminal is electrically connected to the second input/output negative port.

According to some example embodiments, the battery pack may further include a controller controlling the first switch, the second switch and the third switch to be operable to bypass short circuited portions by detecting the short circuited portions from the first battery, the second battery, the first switch, the second switch, the third switch, the first input/output port and the second input/output port.

According to some example embodiments, when a short circuit is generated in the battery pack, the controller may control the first switch, the second switch and the third switch to be operable to output one of voltages of the first battery and the second battery through the first input/output port or the second input/output port.

According to some example embodiments, when a short circuit is generated between the first input/output negative port and the first input/output positive port or between the second switch and the first input/output port, the voltage of the second battery may be output to the second input/output port through the first switch and the third switch.

According to some example embodiments, when short circuits are generated between each of the second battery, the second input/output port and the first switch, the voltage of the first battery may be output to the first input/output port through the second switch and the third switch.

According to some example embodiments, when a short circuit is generated between the first battery and the second battery, the voltage of the second battery may be output to the second input/output port through the first switch and the third switch or the voltage of the first battery is output to the first input/output port through the second switch and the third switch.

As described above, the battery pack for a vehicle according to some example embodiments of the present invention may improve safety by operating the vehicle in a safety mode in which voltages are output while bypassing a short circuited portion, even if an internal short circuit has occurred to the battery pack.

DETAILED DESCRIPTION

Figure 1A:
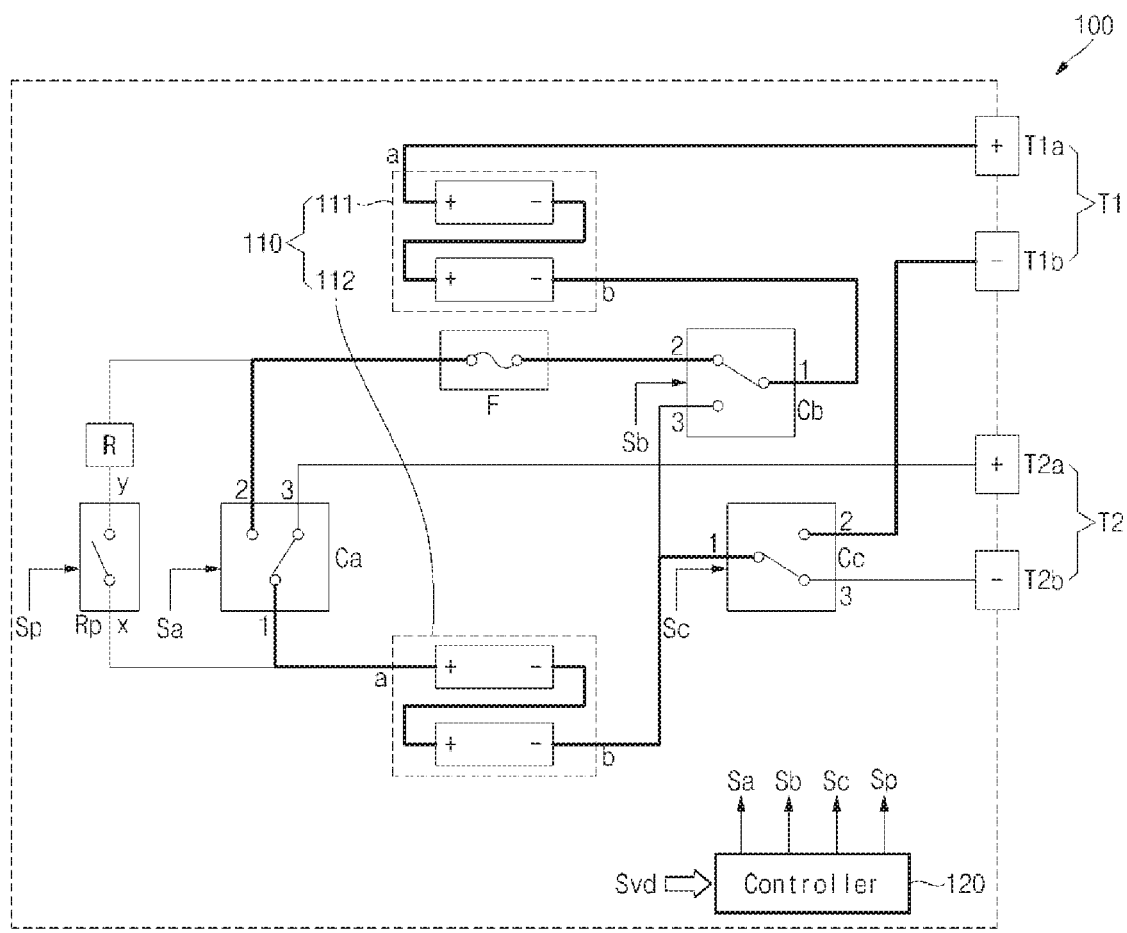
FIGS. 1A and 1B are schematic diagrams of a battery pack for a vehicle and a vehicle driving system having the battery pack mounted therein, according to some example embodiments of the present invention.

Hereinafter, aspects of some example embodiments of the present invention will be described in more detail. Various embodiments of the present invention may be embodied in many different forms and should not be construed as being limited to the example embodiments set forth herein. Rather, these example embodiments of the disclosure are provided so that this disclosure will be more thorough and more complete and will convey inventive concepts of the disclosure to those skilled in the art.

In addition, in the accompanying drawings, sizes or thicknesses of various components are exaggerated for brevity and clarity. Like numbers refer to like elements throughout. In addition, it will be understood that when an element A is referred to as being "connected to" an element B, the element A can be directly connected to the element B or an intervening element C may be present and the element A and the element B are indirectly connected to each other.

The terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprise" and/or "comprising," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc., may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "on" or "above" the other elements or features. Thus, the example term "below" can encompass both an orientation of above and below.

In addition, throughout the specification, similar functional components are denoted by the same reference numeral. In addition, when an element is described as being "coupled to" or "connected to" another element, these elements may be directly "coupled to" or "connected to" each other, or one or more elements may be interposed therebetween.

Figure 1B:
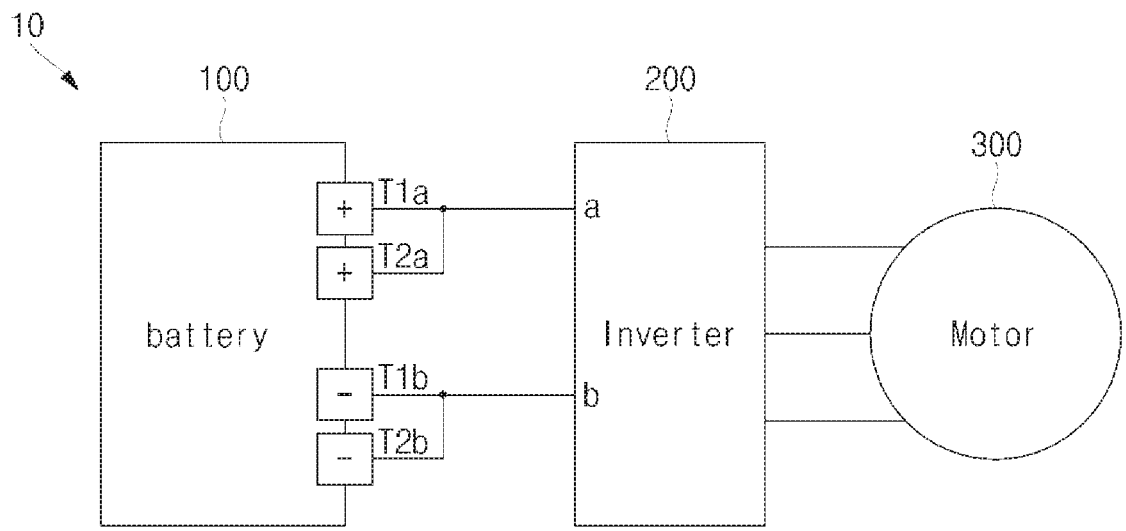

Referring to FIG. 1A, a schematic diagram of a battery pack for a vehicle according to some example embodiments of the present invention is illustrated, and referring to FIG. 1B, a schematic diagram of a vehicle driving system having the battery pack mounted therein is illustrated.

The vehicle driving system 10 may include a battery pack 100 outputting power to drive the vehicle, an inverter 200 electrically connected to the battery pack 100 and supplying power to drive a driving motor 300 using the power supplied from the battery pack 100, and the driving motor 300 operating the vehicle by the power supplied from the inverter 200.

The battery pack 100 may output power to drive the vehicle and may include two input/output ports T1 and T2 to which the power is output. The two input/output ports T1 and T2 of the battery pack 100 may consist of a first input/output port T1 and a second input/output port T2. In addition, the first input/output port T1 may include a first input/output positive port T1a and a first input/output negative port T1b, and the second input/output port T2 may include a second input/output positive port T2a and a second input/output negative port T2b. Internal components of the battery pack 100 will be described below in more detail.

The two input/output ports T1 and T2 of the battery pack 100 may be electrically connected to a positive terminal "a" and a negative terminal "b" of the inverter 200. Here, the first input/output positive port T1a and the second input/output positive port T2a of the battery pack 100 may be electrically connected to the positive terminal "a" of the inverter 200, and the first input/output negative port T1b and the second input/output negative port T2b of the battery pack 100 may be electrically connected to the negative terminal "b" of the inverter 200.

That is to say, the input/output positive ports T1a and T2a of the battery pack 100 are electrically connected to the positive terminal "a" of the inverter 200, and the input/output negative ports T1b and T2b of the battery pack 100 are electrically connected to the negative terminal "b" of the inverter 200. The inverter 200 is a device for converting DC into AC or converting AC to DC. That is to say, the inverter 200 receives DC power from the battery pack 100 and converts DC power to AC power to then supply the converted power to the driving motor 300.

In addition, the inverter 200 may convert AC power generated from the driving motor 300 into DC power to charge the battery pack 100 during regenerative braking. In addition, the inverter 200 may include one or more capacitors connected in parallel to the positive terminal "a" and the negative terminal "b". The inverter 200 may be charged or discharged faster than the battery pack 100 by means of the capacitors, thereby preventing or reducing incidences of the driving motor 300 and/or the battery pack 100 being damaged due to abrupt changes in their conditions.

The driving motor 300 is electrically connected to the inverter 200 and receives power for operating the vehicle from the inverter 200 to generate a torque to operate the vehicle. The driving motor 300 may function as an engine when the vehicle is an electric vehicle.

The battery pack 100 includes a plurality of batteries 110, a plurality of switches Ca, Cb, and Cc for switching connection relationships between the plurality of batteries 110 and the two input/output ports T1 and T2, and a controller 120 for controlling operations of the plurality of switches Ca, Cb, and Cc. In addition, the battery pack 100 may further include a fuse F located between the plurality of batteries 110 and the two input/output ports T1 and T2 to cut off power supply when an over-current is generated due to a short circuit, a precharge relay Rp for applying a precharge voltage to the inverter 200 at the time of starting the vehicle, and a resistor R connected in series to the precharge relay Rp.

The plurality of batteries 110 may include a first battery 111 and a second battery 112. In addition, the first battery 111 and the second battery 112 may include a plurality of battery cells connected in series or in parallel, respectively. While the first battery 111 and the second battery 112 including two battery cells connected in series are illustrated in FIG. 1B, aspects of the present invention are not limited thereto. The first battery 111 and the second battery 112 may include a positive terminal "a" and a negative terminal "b", respectively.

The first battery 111 and the second battery 112 may output voltages between the positive terminal "a" and the negative terminal "b", respectively. The first battery 111 may be configured such that the positive terminal "a" is electrically connected to the first input/output positive port T1a and the negative terminal "b" is electrically connected to a common terminal 1 of the second switch Cb. In addition, the second battery 112 may be configured such that the positive terminal "a" is electrically connected to the common terminal 1 of the first switch Ca and the negative terminal "b" is electrically connected to the common terminal 1 of the third switch Cc.

The plurality of switches Ca, Cb and Cc may include the first switch Ca, the second switch Cb and the third switch Cc. The first switch Ca, the second switch Cb and the third switch Cc are 3-way switches, each including the common terminal 1, a first contact terminal 2, and a second contact terminal 3. The first switch Ca, the second switch Cb, and the third switch Cc may electrically connect the common terminal 1 to the first contact terminal 2 or may electrically connect the common terminal 1 to the second contact terminal 3 by control signals Sa, Sb, and Sc applied from the controller 120. That is to say, the first switch Ca, the second switch Cb, and the third switch Cc may electrically connect the common terminal 1 thereof to the first contact terminal 2 or to the second contact terminal 3 by the control signals Sa, Sb, and Sc of the controller 120, respectively.

The first switch Ca may be configured such that the common terminal 1 is electrically connected to the positive terminal "a" of the second battery 112, the first contact terminal 2 is electrically connected to the first contact terminal 2 of the second switch Cb, and the second contact terminal 3 is electrically connected to the second input/output positive port T2a. The first switch Ca is electrically connected to the controller 120 to electrically connect the common terminal 1 to the first contact terminal 2 or to the second contact terminal 3 by the first control signal Sa applied from the controller 120. That is to say, the first switch Ca may electrically connect the negative terminal "b" of the second battery 112 to the first contact terminal 2 of the second switch Cb or to the second input/output positive port T2a.

The second switch Cb may be configured such that the common terminal 1 is electrically connected to the negative terminal "b" of the first battery 111, the first contact terminal 2 is electrically connected to the first contact terminal 2 of the first switch Ca, and the second contact terminal 3 is electrically connected to the common terminal 1 of the third switch Cc and the negative terminal "b" of the second battery 112. The second switch Cb is electrically connected to the controller 120 to electrically connect the common terminal 1 to the first contact terminal 2 or to the second contact terminal 3 by the second control signal Sb applied from the controller 120. That is to say, the second switch Cb may electrically connect the negative terminal "b" of the first battery 111 to the first contact terminal 2 of the first switch Ca or to the negative terminal "b" of the second battery 112.

The third switch Cc may be configured such that the common terminal 1 is electrically connected to the negative terminal "b" of the second battery 112 and the second contact terminal 3 of the second switch Cb, the first contact terminal 2 is electrically connected to the first input/output negative port T1b, and the second contact terminal 3 is electrically connected to the second input/output negative port T2b. The third switch Cc is electrically connected to the controller 120 to electrically connect the common terminal 1 to the first contact terminal 2 or to the second contact terminal 3 by the third control signal Sc applied from the controller 120. That is to say, the third switch Cc may electrically connect the negative terminal "b" of the second battery 112 to the first input/output negative port T1b or to the second input/output negative port T2b.

During a normal operation of the battery pack 100, the first switch Ca, the second switch Cb, and the third switch Cc may be maintained at a state in which the common terminal 1 and the first contact terminal 2 are electrically connected to each other. In addition, when an internal short circuit occurs to the battery pack 100, the common terminal 1 of each of the first switch Ca, the second switch Cb, and the third switch Cc may be electrically connected to the first contact terminal 2 or to the second contact terminal 3 to bypass the short circuited portion.

If the first switch Ca, the second switch Cb, and the third switch Cc are all configured such that the common terminal 1 and the first contact terminal 2 are electrically connected to each other, the negative terminal "b" of the first battery 111 may be electrically connected to the positive terminal "a" of the second battery 112 in series. Here, the positive terminal "a" of the first battery 111 may be electrically connected to the first input/output positive port T1a, and the negative terminal "b" of the second battery 112 may be electrically connected to the first input/output negative port T1b. That is to say, if the first switch Ca, the second switch Cb, and the third switch Cc are all configured such that the common terminal 1 and the first contact terminal 2 are electrically connected to each other, the voltages of the first battery 111 and the second battery 112 connected in series may be output to the first input/output port T1. As described above, in a situation where the first switch Ca, the second switch Cb, and the third switch Cc are all configured such that the common terminal 1 and the first contact terminal 2 are connected to each other, the power voltages of the first battery 111 and the second battery 112 connected in series may be output to the first input/output port T1 in a state in which a normal power supply line of the battery pack 100 is connected.

The precharge relay Rp may include a first terminal x and a second terminal y. The first terminal x of the precharge relay Rp may be electrically connected between the common terminal 1 of the first switch Ca and the positive terminal "a" of the second battery 112, and the second terminal y may be electrically connected to the first contact terminal 2 of the first switch Ca. The precharge relay Rp has a control terminal electrically connected to the controller 120 to be turned on or off by a control signal Sp applied to the controller 120. In addition, the precharge relay Rp may be connected to the resistor R in series.

In addition, the precharge relay Rp and the resistor R may be connected to the first switch Ca in parallel. If the precharge relay Rp is turned on by the control signal Sp applied to the controller 120, the power voltage output to the two input/output ports T1 and T2 through the resistor R may be slowly increased. The precharge relay Rp and the resistor R may be provided to prevent the vehicle driving system 10 from being damaged due to a high voltage abruptly supplied to the battery pack 100, for example, at a time of starting a vehicle engine.

In addition, the fuse F may be provided between the first contact terminal 2 of the first switch Ca and the first contact terminal 2 of the second switch Cb. The fuse F may be electrically connected to the normal power supply line of the battery pack 100 and may cut off power supply by being melted when a high current flows in the normal power supply line of the battery pack 100 due to occurrence of a short circuit.

In addition, the controller 120 may be electrically connected to the first switch Ca, the second switch Cb, the third switch Cc and the precharge relay Rp to control the same to be operable. In addition, the controller 120 may receive voltage values Svd measured by a plurality of voltage sensors (not shown) provided within the battery pack 100. According to some example embodiments, the voltage sensors may include a plurality of voltage sensors provided in the normal power supply line of the battery pack 100. For example, the plurality of voltage sensors may be mounted in the positive terminal "a" and the negative terminal "b" of the first battery 111 and the second battery 112, respectively.

In addition, the plurality of voltage sensors may be mounted in the common terminal 1, the first contact terminal 2, and the second contact terminal 3 of the first switch Ca, the second switch Cb, and the third switch Cc, respectively. That is to say, the plurality of voltage sensors may measure the voltage values Svd from the respective terminals of the first battery 111, the second battery 112, the first switch Ca, the second switch Cb, and the third switch Cc to then transmit the measured voltage values Svd to the controller 120. The controller 120 may receive the voltage values Svd measured by the plurality of voltage sensors provided in the battery pack 100 to determine positions of short circuited portions and may control operations of the first switch Ca, the second switch Cb, and the third switch Cc according to the positions of the short circuited portions. That is to say, the controller 120 may control the first switch Ca, the second switch Cb, and the third switch Cc to be operable to output power voltages through by-passing routes when a short circuit is caused to the normal power supply line of the battery pack 100. Additionally, the controller 120 may be provided outside the battery pack 100, and the present invention does not limit the configuration of the controller 120 to that disclosed herein.

Figure 2:
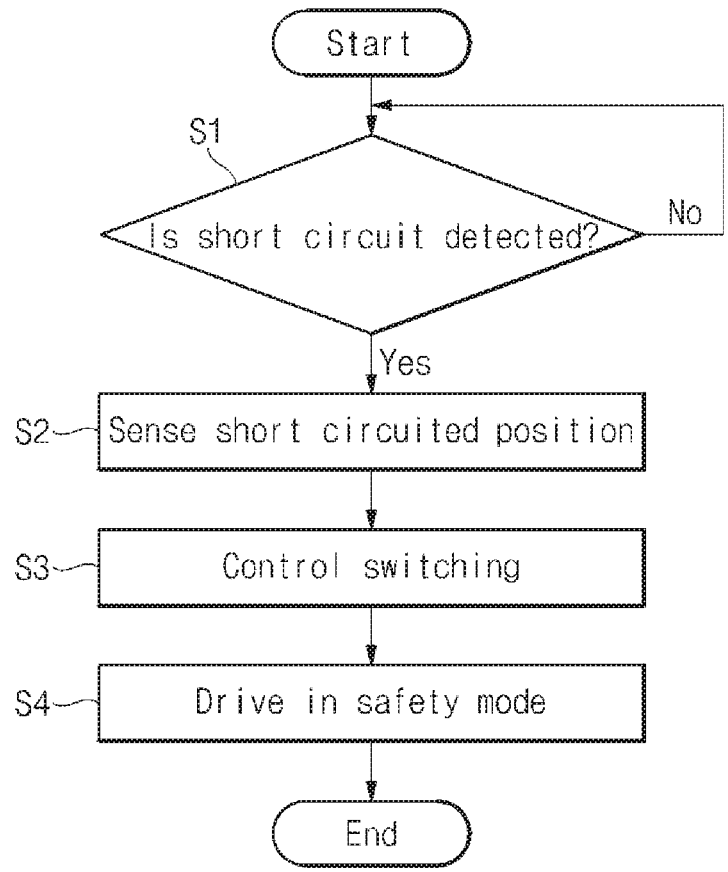
FIG. 2 is a flow diagram illustrating a method of controlling a plurality of switches of the battery pack shown in FIG. 1A.

Referring to FIG. 2, a flow diagram illustrating a method of controlling a plurality of switches of the battery pack shown in FIG. 1A is illustrated, and referring to FIGS. 3A to 3E, schematic diagrams illustrating examples of connection relationships of a plurality of switches Ca, Cb, and Cc according to short circuited portions in the battery pack shown in FIG. 1A are illustrated. Hereinafter, controlling of the switches depending on internal short circuits of the battery pack 100 will be described with reference to FIGS. 2 and 3A to 3E.

As illustrated in FIG. 2, the method of controlling a plurality of switches of the battery pack for a vehicle may include a short circuit detecting operation (S1), a short circuited position sensing operation (S2), a switching controlling operation (S3), and a safety driving operation (S4). Embodiments according the present invention are not limited to the number and order of operations illustrated in FIG. 2, however, and some example embodiments may include additional or fewer operations, or the order of the operations may vary, unless otherwise stated or implied by the description below.

At the operation of detecting a short circuit (S1), the controller 120 may receive the voltage values Svd measured by the plurality of voltage sensors provided in the battery pack 100 to check whether a short circuit has occurred to the battery pack 100. For example, the controller 120 may receive the voltage values Svd measured by the plurality of voltage sensors mounted in the normal power supply line of the battery pack 100 to then compare the same with normal voltage values, and may determine that a short circuit has occurred if there are different voltage values.

In addition, the controller 120 may determine that a short circuit has occurred if a voltage value between both terminals of the fuse F, that is, the first contact terminal 2 of the second switch Cb and the first contact terminal 2 of the first switch Ca, is not measured, which is caused when the fuse F is melted due to an over-voltage caused by the short circuit occurring to the normal power supply line. When it is determined that an internal short circuit has occurred to the battery pack 100, the controller 120 may sense a position of a short circuited portion through the voltage values Svd measured by the plurality of voltage sensors. In addition, when it is determined that an internal short circuit has not occurred to the battery pack 100, the controller 120 may continue to detect whether a short circuit has occurred or not based on the voltage values Svd measured by the plurality of voltage sensors.

At the operation of sensing a short circuited position (S2), the controller 120 having received the voltage values Svd measured by the plurality of voltage sensors may detect the short circuited position. After receiving the voltage values Svd measured by the plurality of voltage sensors provided in the normal power supply line of the battery pack 100, the controller 120 may compare the received voltage values Svd with normal voltage values and may determine that a short circuit has occurred to a portion where the compared voltage values are different. The short circuited position sensing operation (S2) may be performed at the same time with the short circuit detecting operation (S1). For example, if any one among the voltage values Svd measured by the plurality of voltage sensors mounted in the normal power supply line of the battery pack 100 is different from the normal voltage value, the controller 120 may determine that a short circuit has occurred and that a portion where the measured voltage value is different from the normal voltage value is a short circuited portion.

At the operation of controlling switching (S3), the controller 120 controls the plurality of switches Ca, Cb, and Cc to be operable to bypass the short circuited portion as determined by the controller 120. The switching controlling operation (S3) will now be described by way of example with reference to FIGS. 3A to 3E.

Figure 3A:
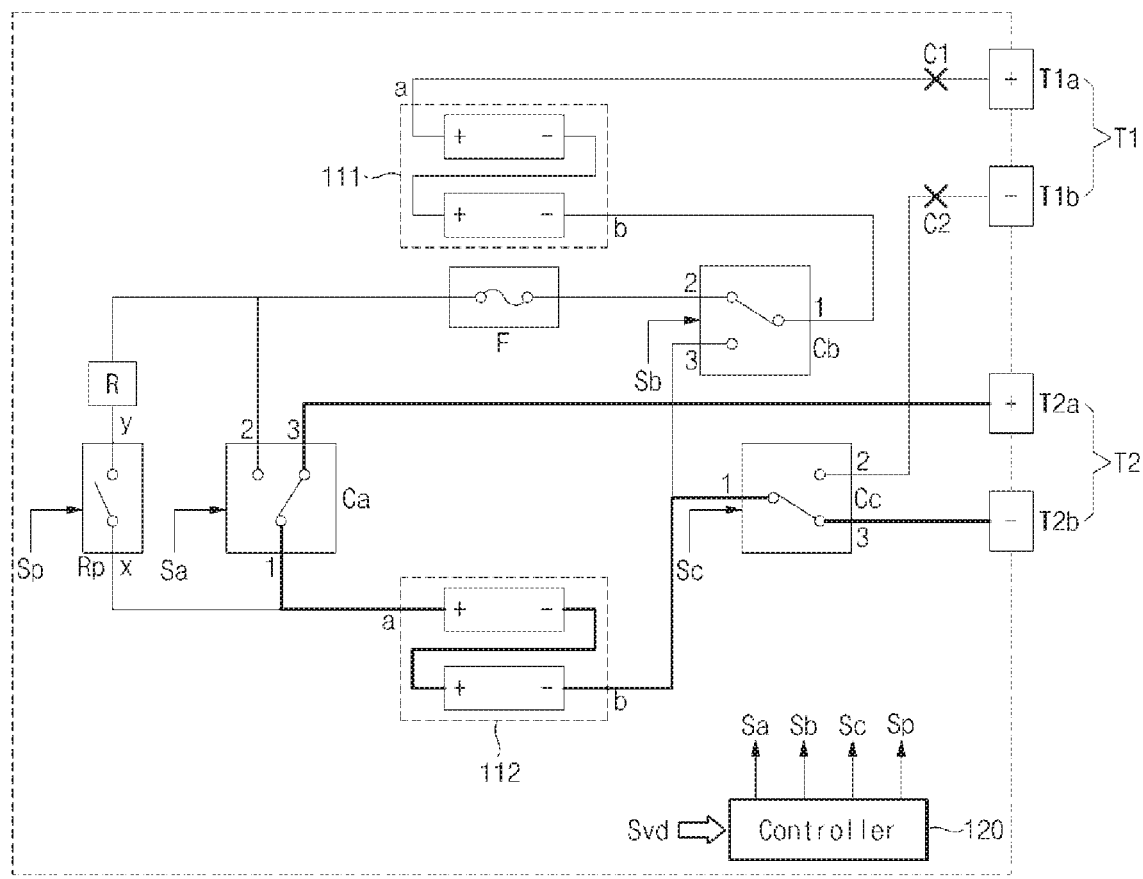
FIGS. 3A to 3E are schematic diagrams illustrating examples of connection relationships of a plurality of switches according to short circuited portions in the battery pack shown in FIG. 1A.

Referring to FIG. 3A, in a situation where the controller 120 determines at the short circuited position sensing operation (S2) that short circuited portions C1 and C2 are generated between the first input/output positive port T1a and the first input/output negative port T1b, an example of operating the plurality of switches Ca, Cb and Cc is illustrated. Here, the first short circuited portion C1 may be positioned between the first input/output positive port T1a and the positive terminal "a" of the first battery 111, and the second short circuited portion C2 may be positioned between the first input/output negative port T1b and the first contact terminal 2 of the third switch Cc.

When a short circuit has occurred to the first input/output port T1, the controller 120 may control outputs of the plurality of batteries 110 to be output to the second input/output port T2. That is to say, when the short circuited portion is generated between the first input/output positive port T1a and the first input/output negative port T1b, the controller 120 may control the first switch Ca to electrically connect the common terminal 1 to the second contact terminal 3, may control the second switch Cb to electrically connect the common terminal 1 to the first contact terminal 2, and may control the third switch Cc to electrically connect the common terminal 1 to the second contact terminal 3. That is to say, the battery pack 100 may output voltages between the positive terminal "a" and the negative terminal "b" of the second battery 112 through the second input/output positive port T2a and the second input/output negative port T2b. Here, the battery pack 100 outputs only the voltage of the second battery 112, that is, a relatively low voltage, which is half of the voltage output from the battery pack 100 in a normal operating state in which the voltages of both of the first battery 111 and the second battery 112 connected in series are output. In such a manner, the controller 120 may control the plurality of switches Ca, Cb, and Cc to be operable to bypass positions of the short circuited portions C1 and C2, thereby allowing the voltages of the plurality of batteries 110 to be output through the second input/output port T2.

Figure 3B:
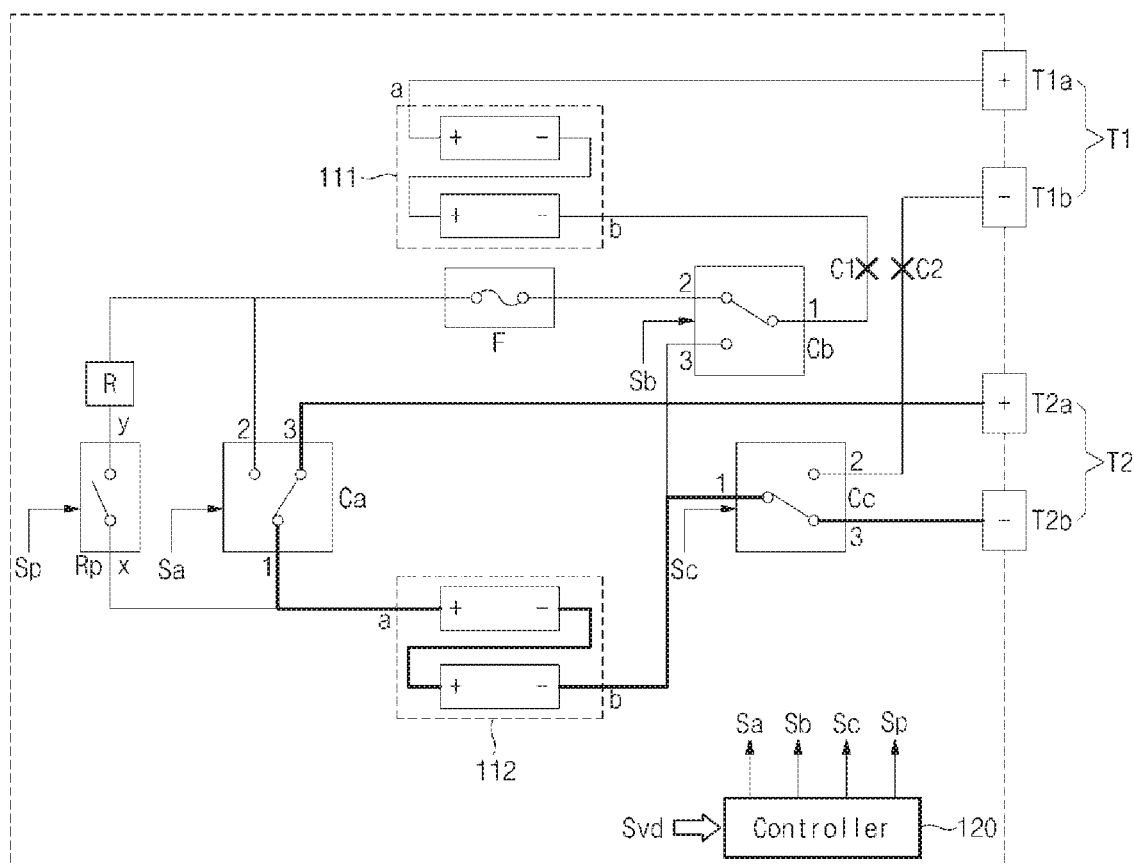

Referring to FIG. 3B, in a situation where the controller 120 determines in the short circuited position sensing operation (S2) that short circuited portions C1 and C2 are generated between the negative terminal "b" of the first battery 111 and the first input/output negative port T1b, an example of operating the plurality of switches Ca, Cb, and Cc is illustrated. Here, the first short circuited portion C1 may be positioned between the negative terminal "b" of the first battery 111 and the common terminal 1 of the first switch Ca, and the second short circuited portion C2 may be positioned between the first input/output negative port T1b and the first contact terminal 2 of the third switch Cc.

When a short circuit is generated between the negative terminal "b" of the first battery 111 and the first input/output negative port T1b, the controller 120 may control outputs of the plurality of batteries 110 to be output to the second input/output port T2. That is to say, when the short circuit has occurred between the negative terminal "b" of the first battery 111 and the first input/output negative port T1b, the controller 120 may control the first switch Ca to electrically connect the common terminal 1 to the second contact terminal 3, may control the second switch Cb to electrically connect the common terminal 1 to the first contact terminal 2, and may control the third switch Cc to electrically connect the common terminal 1 to the second contact terminal 3.

That is to say, the battery pack 100 may output voltages between the positive terminal "a" and the negative terminal "b" of the second battery 112 through the second input/output positive port T2a and the second input/output negative port T2b. Here, the battery pack 100 outputs only the voltage of the second battery 112, that is, a relatively low voltage, which is half of the voltage output from the battery pack 100 in a normal operating state in which the voltages of both of the first battery 111 and the second battery 112 connected in series are output.

In such a manner, the controller 120 may control the plurality of switches Ca, Cb, and Cc to be operable to bypass positions of the short circuited portions C1 and C2, thereby allowing the voltages of the plurality of batteries 110 to be output through the second input/output port T2. In addition, when the first circuited portion C1 is positioned within the first switch Ca, the controller 120 may also control the plurality of switches Ca, Cb, and Cc to be operable in the same manner as described above.

Figure 3C:
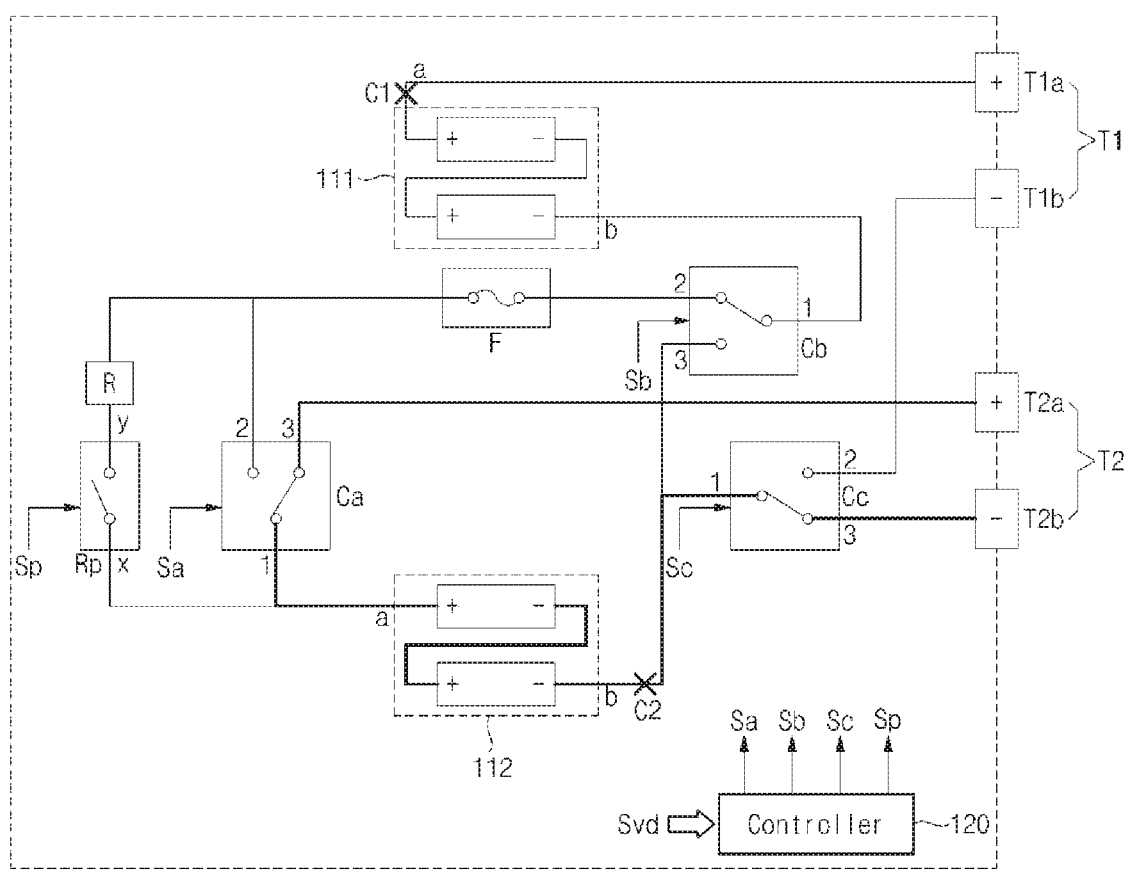

Referring to FIG. 3C, in a situation where the controller 120 determines in the short circuited position sensing operation (S2) that short circuited portions C1 and C2 are generated between the positive terminal "a" of the first battery 111 and the negative terminal "b" of the second battery 112, an example of operating the plurality of switches Ca, Cb and Cc is illustrated. Here, the first short circuited portion C1 may be positioned between the positive terminal "a" of the first battery 111 and the first input/output positive port T1a, and the second short circuited portion C2 may be positioned between the negative terminal "b" of the second battery 112 and the second contact terminal 3 of the third switch Cc.

When a short circuit is generated between the positive terminal "a" of the first battery 111 and the negative terminal "b" of the second battery 112, the controller 120 may control the plurality of batteries 110 to be driven to electrically connect only one of the first battery 111 and the second battery 112 to the first and second input/output ports T1 and T2. FIG. 3C illustrates a situation where only the voltage of the second battery 112 is output through the second input/output port T2. When the short circuit is generated between the positive terminal "a" of the first battery 111 and the negative terminal "b" of the second battery 112, the controller 120 may control the first switch Ca to electrically connect the common terminal 1 to the second contact terminal 3, may control the second switch Cb to electrically connect the common terminal 1 to the first contact terminal 2 and may control the third switch Cc to electrically connect the common terminal 1 to the second contact terminal 3. That is to say, the battery pack 100 may output voltages between the positive terminal "a" and the negative terminal "b" of the second battery 112 through the second input/output positive port T2a and the second input/output negative port T2b.

Here, the battery pack 100 outputs only the voltage of the second battery 112, that is, a relatively low voltage, which is half of the voltage output from the battery pack 100 in a normal operating state in which the voltages of both of the first battery 111 and the second battery 112 connected in series are output. In such a manner, the controller 120 may control the plurality of switches Ca, Cb, and Cc to be operable to bypass the short circuited portions C1 and C2, thereby allowing the voltages of the plurality of batteries 110 to be output through the second input/output port T2. In addition, when the first circuited portion C1 is positioned within the first switch Ca, the controller 120 may also control the plurality of switches Ca, Cb and Cc to be operable in the same manner as described above.

Figure 3D:
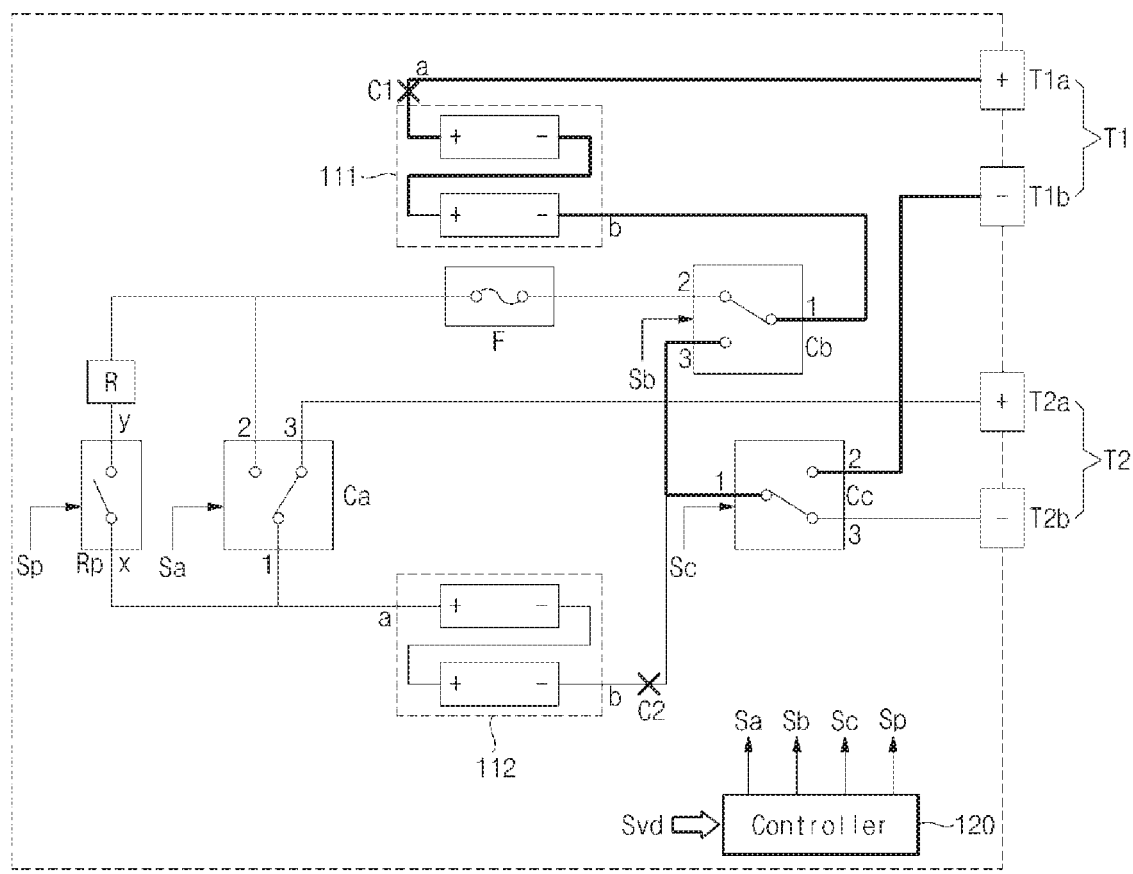

Referring to FIG. 3D, like in FIG. 3C, in a situation where the controller 120 determines in the short circuited position sensing operation (S2) that short circuited portions C1 and C2 are generated between the positive terminal "a" of the first battery 111 and the negative terminal "b" of the second battery 112, another example of operating the plurality of switches Ca, Cb and Cc is illustrated. Here, the first short circuited portion C1 may be positioned between the positive terminal "a" of the first battery 111 and the first input/output positive port T1a, and the second short circuited portion C2 may be positioned between the negative terminal "b" of the second battery 112 and the second contact terminal 3 of the third switch Cc.

When a short circuit is generated between the positive terminal "a" of the first battery 111 and the negative terminal "b" of the second battery 112, the controller 120 may control the plurality of batteries 110 to be driven to electrically connect only one of the first battery 111 and the second battery 112 to the first and second input/output ports T1 and T2. FIG. 3D illustrates a situation where only the voltage of the first battery 111 is output through the first input/output port T1. When the short circuit is generated between the positive terminal "a" of the first battery 111 and the negative terminal "b" of the second battery 112, the controller 120 may control the first switch Ca to electrically connect the common terminal 1 to the first contact terminal 2, may control the second switch Cb to electrically connect the common terminal 1 to the second contact terminal 3 and may control the third switch Cc to electrically connect the common terminal 1 to the first contact terminal 2. That is to say, the battery pack 100 may output voltages between the positive terminal "a" and the negative terminal "b" of the first battery 111 through the first input/output positive port T1a and the first input/output negative port T1b.

Here, the battery pack 100 outputs only the voltage of the second battery 112, that is, a relatively low voltage, which is half of the voltage output from the battery pack 100 in a normal operating state in which the voltages of both of the first battery 111 and the second battery 112 connected in series are output. In such a manner, the controller 120 may control the plurality of switches Ca, Cb, and Cc to be operable to bypass the short circuited portions C1 and C2, thereby allowing the voltages of the plurality of batteries 110 to be output through the first input/output port T1. In addition, when the first circuited portion C1 is positioned within the first switch Ca, the controller 120 may also control the plurality of switches Ca, Cb, and Cc to be operable in the same manner as described above.

Figure 3E:
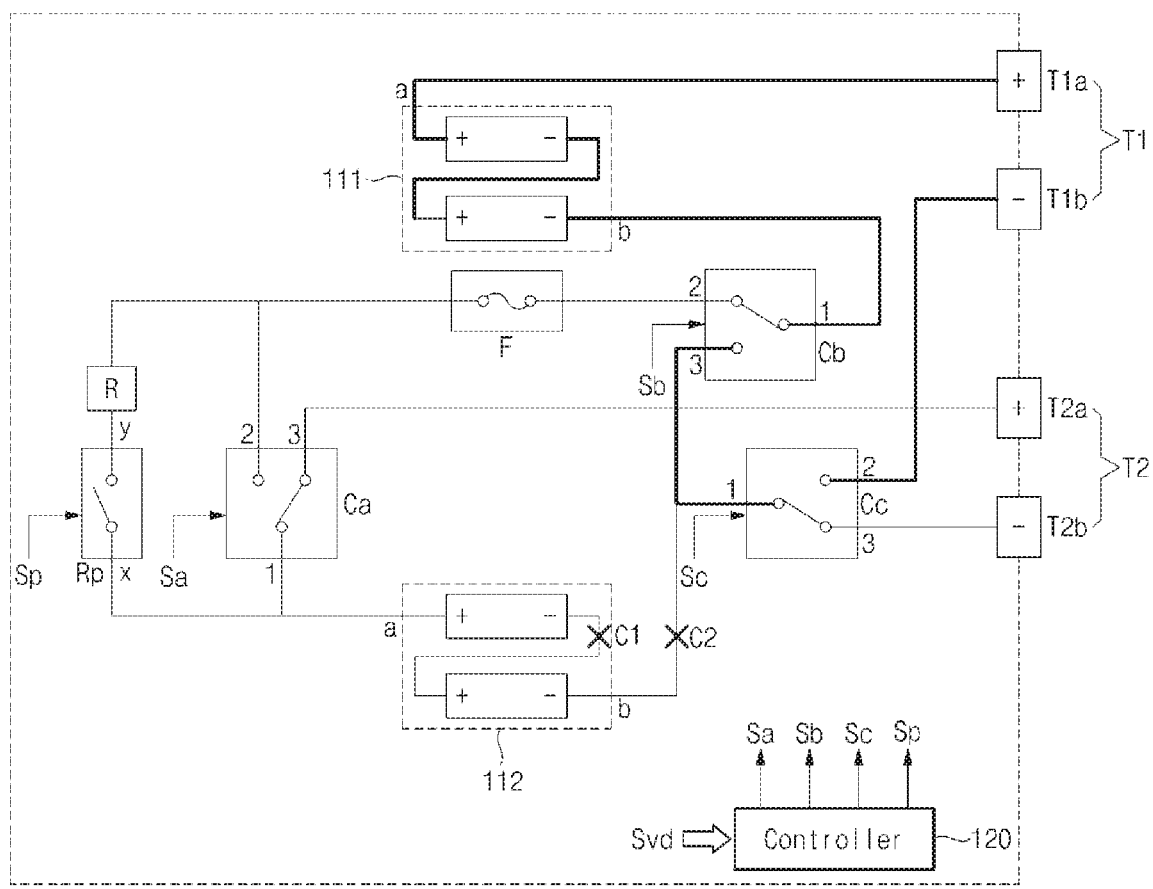

Referring to FIG. 3E, in a situation where the controller 120 determines in the short circuited position sensing operation (S2) that short circuited portions C1 and C2 are generated between the inside of the second battery 112 and the negative terminal "b" of the second battery 112, another example of operating the plurality of switches Ca, Cb, and Cc is illustrated. Here, the first short circuited portion C1 may be positioned within the second battery 112, and the second short circuited portion C2 may be positioned between the negative terminal "b" of the second battery 112 and the common terminal 1 of the third switch Cc.

When a short circuit is generated between the inside of the second battery 112 and the negative terminal "b" of the second battery 112, the controller 120 may control outputs of the plurality of batteries 110 to be output to the first input/output port T1. When the short circuit is generated between the inside of the second battery 112 and the negative terminal "b" of the second battery 112, the controller 120 may control the first switch Ca to electrically connect the common terminal 1 to the first contact terminal 2, may control the second switch Cb to electrically connect the common terminal 1 to the second contact terminal 3 and may control the third switch Cc to electrically connect the common terminal 1 to the first contact terminal 2. That is to say, the battery pack 100 may output voltages between the positive terminal "a" and the negative terminal "b" of the first battery 111 through the first input/output positive port T1a and the first input/output negative port T1b.

Here, the battery pack 100 outputs only the voltage of the first battery 111, that is, a relatively low voltage, which is half of the voltage output from the battery pack 100 in a normal operating state in which the voltages of both of the first battery 111 and the second battery 112 connected in series are output. In such a manner, the controller 120 may control the plurality of switches Ca, Cb, and Cc to be operable to bypass the short circuited portions C1 and C2, thereby allowing the voltages of the plurality of batteries 110 to be output through the first input/output port T1. In addition, when the first circuited portion C1 and the second circuited portion C2 are generated at the first switch Ca and the second input/output port T2, the controller 120 may also control the plurality of switches Ca, Cb, and Cc to be operable in the same manner as described above.

At the operation of driving in a safety mode (S4), when a short circuit is generated within the battery pack 100, a low voltage is output through a bypass route, so that the vehicle driving system 10 may operate the driving motor 300 in the safety mode using the low voltage. Here, in the safety mode, the low voltage output from the battery pack 100 may be supplied to the driving motor 300 through the inverter 200, and the driving motor 300 may supply driving power to allow a vehicle to be driven only at a low speed. In addition, in a situation where the vehicle is in the safety driving mode, the driver is notified that the vehicle is in the safety driving mode by means of a warning light installed in the vehicle, thereby allowing the driver to check the vehicle.

When a short circuit is generated within a battery pack mounted in an electric vehicle, output voltages may be cut off, making the vehicle come to stop. However, in the battery pack 100 for a vehicle according to the present invention, even if a short circuit is generated within the battery pack 100, the battery pack 100 outputs a low voltage while bypassing the short circuited portion, to make the vehicle driven in a safety mode, thereby improving the safety of the vehicle.

While the battery pack for a vehicle according to the present invention has been particularly shown and described with reference to example embodiments thereof, it will be understood by those of ordinary skill in the art that various changes in form and details may be made therein without departing from the spirit and scope of the present invention as defined by the following claims, and their equivalents.

What is claimed is:

1. A battery pack for a vehicle, the battery pack comprising:
   a plurality of batteries including a first battery and a second battery;
   a first input/output port including a first input/output positive port electrically connected to a positive terminal of the first battery and a first input/output negative port electrically connected to a negative terminal of the second battery;

a second input/output port including a second input/output positive port electrically connected to a positive terminal of the second battery and a second input/output negative port electrically connected to the negative terminal of the second battery;

a first switch configured to electrically connect the positive terminal of the second battery either to the negative terminal of the first battery or to the second input/output positive port;

a second switch configured to electrically connect the negative terminal of the first battery either to the first switch or to the first input/output negative port; and a third switch configured to electrically connect the negative terminal of the second battery to the first input/output negative port or electrically connecting the second switch to the first input/output negative port or to the second input/output negative port, wherein the first switch, the second switch, and the third switch are 3-way switches.

2. The battery pack of claim 1, wherein in a normal operating state in which there is no internal short circuit occurring in the battery pack, the first switch, the second switch, and the third switch are configured such that first contact terminals thereof are all electrically connected to a corresponding common terminal thereof such that the battery pack is configured to output voltages of the first battery and the second battery connected in series to the first input/output port through a normal power supply line.

3. The battery pack of claim 2, wherein the first switch is configured such that the common terminal is electrically connected to the positive terminal of the second battery, the first contact terminal is electrically connected to the first contact terminal of the second switch, and a second contact terminal is electrically connected to the second input/output positive port.

4. The battery pack of claim 2, wherein the second switch is configured such that the common terminal is electrically connected to the negative terminal of the first battery, the first contact terminal is electrically connected to the first contact terminal of the first switch, and a second contact terminal is electrically connected between the negative terminal of the second battery and the common terminal of the third switch.

5. The battery pack of claim 2, wherein the third switch is configured such that the common terminal is electrically connected between the negative terminal of the second battery and a second contact terminal of the second switch, the first contact terminal is electrically connected to the first input/output negative port, and the second contact terminal is electrically connected to the second input/output negative port.

6. The battery pack of claim 2, further comprising a controller configured to control the first switch, the second switch, and the third switch based on a detection of one or more short circuited portions of the first battery, the second battery, the first switch, the second switch, the third switch, the first input/output port and the second input/output port.

7. The battery pack of claim 6, wherein the controller is configured to control the first switch, the second switch, and the third switch to be operable to output one of voltages of the first battery and the second battery through the first input/output port or the second input/output port in response to a short circuit being generated in the battery pack.

8. The battery pack of claim 2, wherein the voltage of the second battery is output to the second input/output port through the first switch and the third switch in response to a short circuit being generated between the first input/output negative port and the first input/output positive port or between the second switch and the first input/output port.

9. The battery pack of claim 2, wherein the voltage of the first battery is output to the first input/output port through the second switch and the third switch in response to short circuits being generated between each of the second battery, the second input/output port and the first switch.

10. The battery pack of claim 2, wherein the voltage of the second battery is output to the second input/output port through the first switch and the third switch or the voltage of the first battery is output to the first input/output port through the second switch and the third switch in response to a short circuit being generated between the first battery and the second battery.

* * * * *